(12) United States Patent
Park

(10) Patent No.: US 8,013,821 B2
(45) Date of Patent: Sep. 6, 2011

(54) LIQUID CRYSTAL DISPLAY DEVICE, METHOD OF DRIVING THE SAME, AND METHOD OF FABRICATING THE SAME

(75) Inventor: Mun-Soo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1043 days.

(21) Appl. No.: 11/846,438

(22) Filed: Aug. 28, 2007

(65) Prior Publication Data

US 2008/0055297 A1 Mar. 6, 2008

(30) Foreign Application Priority Data

Sep. 1, 2006 (KR) .................. 10-2006-0084287

(51) Int. Cl.
*G09G 3/36* (2006.01)

(52) U.S. Cl. ............................ 345/87; 345/102; 349/61

(58) Field of Classification Search ............ 345/87–100, 345/102, 204, 207; 349/56, 61, 84
See application file for complete search history.

(56) References Cited

U.S. PATENT DOCUMENTS

| | | | | |
|---|---|---|---|---|
| 6,559,826 B1 * | 5/2003 | Mendelson et al. | ........... | 345/102 |
| 7,420,538 B2 * | 9/2008 | Murao et al. | ................... | 345/101 |
| 7,460,103 B2 * | 12/2008 | Konno et al. | ................. | 345/102 |
| 2006/0125773 A1 * | 6/2006 | Ichikawa et al. | .............. | 345/102 |

* cited by examiner

*Primary Examiner* — Kimnhung Nguyen
(74) *Attorney, Agent, or Firm* — Innovation Counsel LLP

(57) ABSTRACT

A liquid crystal display includes a display panel, a first sensor, a light emitting unit, a second sensor and a controller. The first sensor is provided in the display panel to detect input light, which is incident from an exterior. The second sensor is provided in the display panel or the light emitting unit so as to detect output light generated from the light emitting unit. The controller analyzes the input light detected by the first sensor and controls the light emitting unit so as to generate the output unit corresponding to an analysis value.

28 Claims, 16 Drawing Sheets

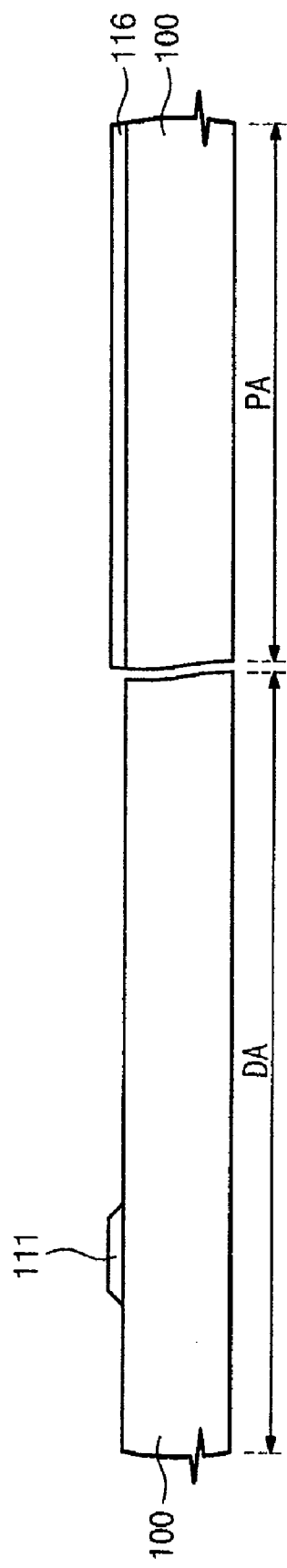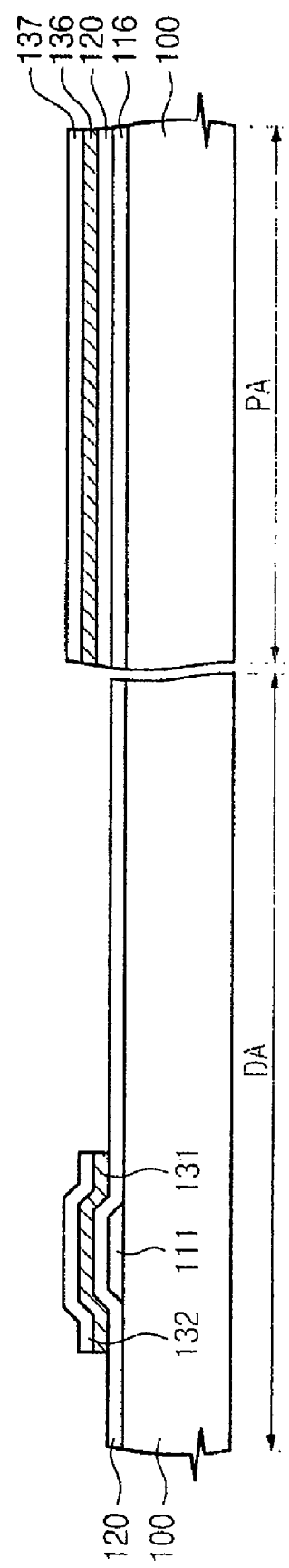

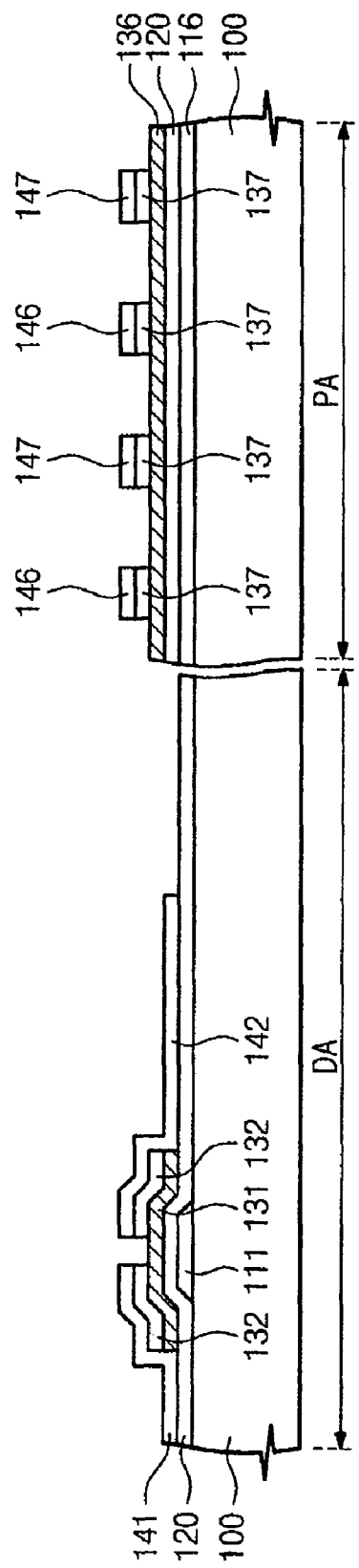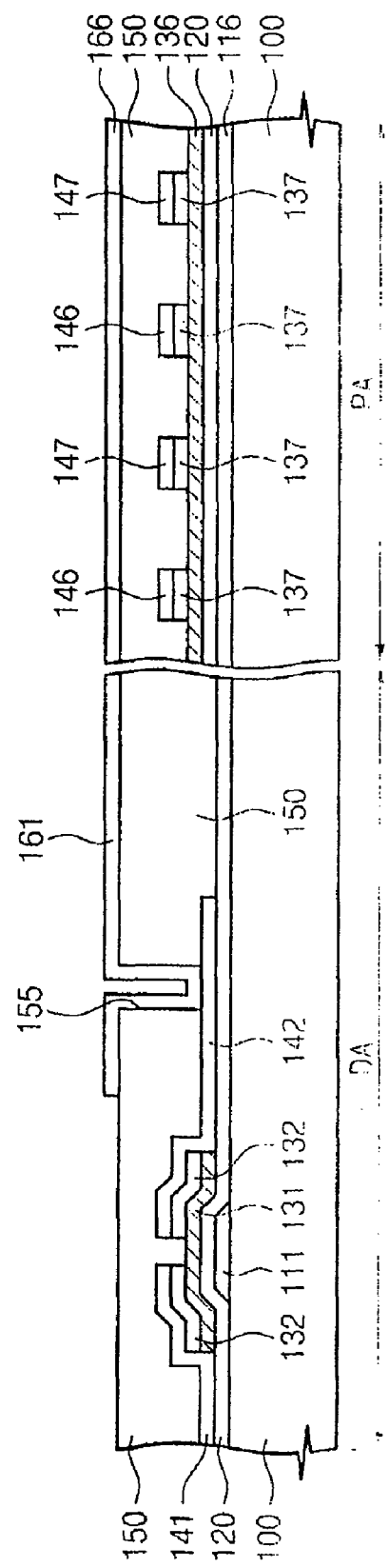

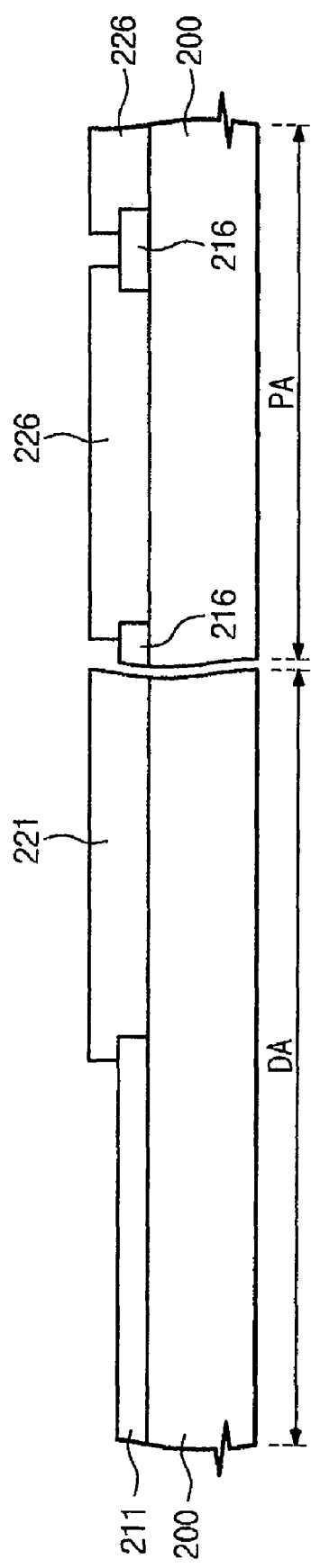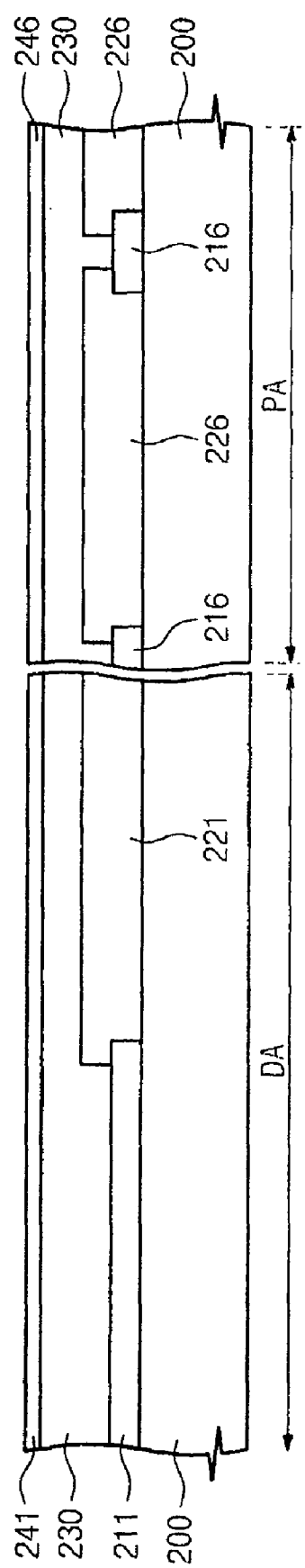

LIQUID CRYSTAL DISPLAY DEVICE, METHOD OF DRIVING THE SAME, AND METHOD OF FABRICATING THE SAME

CROSS-REFERENCE TO RELATED APPLICATION

This application relies for priority upon Korean Patent Application No. 2006-84287 filed on Sep. 1, 2006, the contents of which are herein incorporated by reference in its entirety.

BACKGROUND OF THE INVENTION

1. Field of the Invention

The present invention relates to a liquid crystal display device and, more particularly, to a device capable of displaying high-quality images by analyzing the incident light.

2. Description of the Related Art

Display apparatus may be classified as emissive or non-emissive display apparatus. Emissive display apparatus includes cathode ray tube and organic light emitting devices. Non-emissive display apparatus includes liquid crystal display device that require a separate light source to generate light.

The non-emissive liquid crystal display device includes a display panel that displays images and a light emitting unit to provide light to the display panel. The light emitting unit has a plurality of lamps. These lamps transmit light to the display paneland include either external electrode fluorescent lamp (EEFL) or cold cathode fluorescent lamp (CCFL).

The EEFL provides the display panel with monochromatic light and the quality of an image displayed on the display panel is determined according to the brightness of the monochromatic light. However, the brightness of the monochromatic light it depends on the external environment, so the image quality of the liquid crystal display device may be lowered under specific external environment.

SUMMARY OF THE INVENTION

According to one aspect of the present invention, a liquid crystal display device capable of displaying high-quality images analyzes the incident light and includes a display panel, a first sensor, a light emitting unit, a second sensor and a controller. The first sensor is provided in the display panel to detect input light incident from the exterior. The light emitting unit has at least two different light sources and provides output light to the display panel having various colors. The second sensor is provided in the display panel or the light emitting unit so as to detect the output light. The controller obtains an analysis value for the input light detected by the first sensor and calculates a target value for the output light, individually controls the light sources to generate colored lights corresponding to the target value, and inspects whether the output light detected by the second sensor satisfies the target value.

According to another aspect of the invention, a liquid crystal display device includes a first substrate, a second substrate, a liquid crystal layer and a sensor. The first substrate has a display area where pixel areas are defined and a peripheral area surrounding the display area. The second substrate faces the first substrate. The liquid crystal layer is interposed between the first and second substrates. The sensor is provided in the peripheral area so as to detect light incident through the second substrate.

The sensor includes first and second liquid crystal control electrodes. The first liquid crystal control electrode is formed on the first substrate adjacent to the liquid crystal layer. The second liquid crystal control electrode is formed on the second substrate adjacent to the liquid crystal layer. The second liquid crystal control electrode interacts with the first liquid crystal control electrode so as to apply an electric field to the liquid crystal layer.

The sensor detects the input light when the electric field is applied. Information about the input light includes the state variation of the input light that occurs when the input light passes through the liquid crystal layer when the electric field is applied. The electric field includes first and second electric fields, which are alternately applied in opposition to each other, the first sensor detects the input light when the first electric field is applied. The information about the input light includes phase variation of the input light that occurs when the input light passes through the liquid crystal layer to which the first electric field is applied.

The liquid crystal display device according to the present invention is driven as follows. First, the input light incident into the display panel is detected. Then, an analysis value for the detected input light is obtained. A target value for the output light, corrected according to the analysis value, is calculated. Colored light corresponding to the target value is generated by individually controlling at least two different light sources that generate colored lights different from each other. The output light generated by the colored lights is provided to the display panel.

The liquid crystal display device according to the present invention is fabricated as follows. First, a gate electrode is formed on each pixel area of a first substrate where pixel areas are defined and a peripheral area surrounding the display area. Then, a light blocking layer is formed on the peripheral area of the first substrate. A first semiconductor layer is formed on the gate electrode. A second semiconductor layer is formed on the light blocking layer. A source electrode and a drain electrode are formed on the first semiconductor layer while being spaced apart from each other. First and second electrodes are formed on the second semiconductor layer while being spaced apart from each other. A pixel electrode, which is electrically connected to the drain electrode, is formed on the source and drain electrodes. A first liquid crystal control electrode is formed to cover the first and second electrodes. Then, a common electrode is formed on a second substrate such that the common electrode faces the pixel electrode in the display area. After that, a second liquid crystal electrode is formed on the second substrate such that the second electrode faces the first liquid crystal control electrode in the peripheral area.

BRIEF DESCRIPTION OF THE DRAWINGS

The above and other advantages of the present invention will become readily apparent by reference to the following detailed description when considered in conjunction with the accompanying drawings, in which:

FIGS. 14A to 14G are sectional views showing the method of manufacturing the liquid crystal display device according to an exemplary embodiment of the present invention.

DESCRIPTION OF THE EMBODIMENTS

Figure 1:
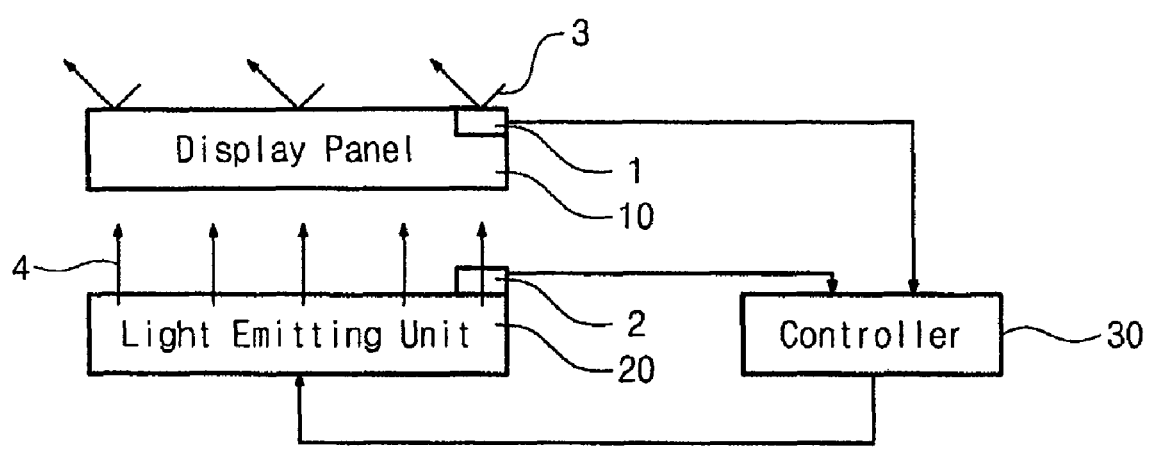
FIG. 1 is a block diagram showing the structure of a liquid crystal display device according to a first embodiment of the present invention.

FIG. 1 is a block diagram showing the structure of a liquid crystal display device according to a first embodiment of the present invention.

Referring to FIG. 1, the liquid crystal display device includes a display panel 10, a light emitting unit 20, and a controller 30. The display panel 10 includes a light crystal layer having liquid crystals therein. The light emitting unit 20 includes a plurality of light sources and provides the display panel 10 with light generated from the light sources.

The liquid crystals exhibit dielectric anisotropy that causes the alignment direction of the liquid crystals to change with the applied electric field. In addition, the liquid crystals exhibit reflective anisotropy which causes the transmittance of light passing through the liquid crystals to vary depending on the alignment direction of the liquid crystals. As the light generated from the light emitting unit 20 passes through the liquid crystal layer, the applied electric field controls the transmittance of light through the liquid crystals so as to display desired images on the display panel 10.

A first sensor 1 is provided in the display panel 10, and a second sensor 2 is provided in the light emitting unit 20. Although not illustrated in FIG. 1, the second sensor 2 can be installed in the display panel 10 in addition to the light emitting unit 20. The first sensor 1 detects input light 3 and the second sensor 2 detects output light 4. The input light 3 includes natural light or artificial light incident from the exterior. The output light 4 includes white light or colored light provided to the display panel 10 from the light emitting unit 20.

The controller 30 analyzes the input light 3 detected by the first sensor 1 and controls the light emitting unit 20 so as to generate the appropriate output light 4. In addition, the controller 30 inspects the output light 4 detected by the second sensor 2. Hereinafter, the operation of the liquid crystal display device under the control of the controller 30 will be described in detail.

Figure 2:
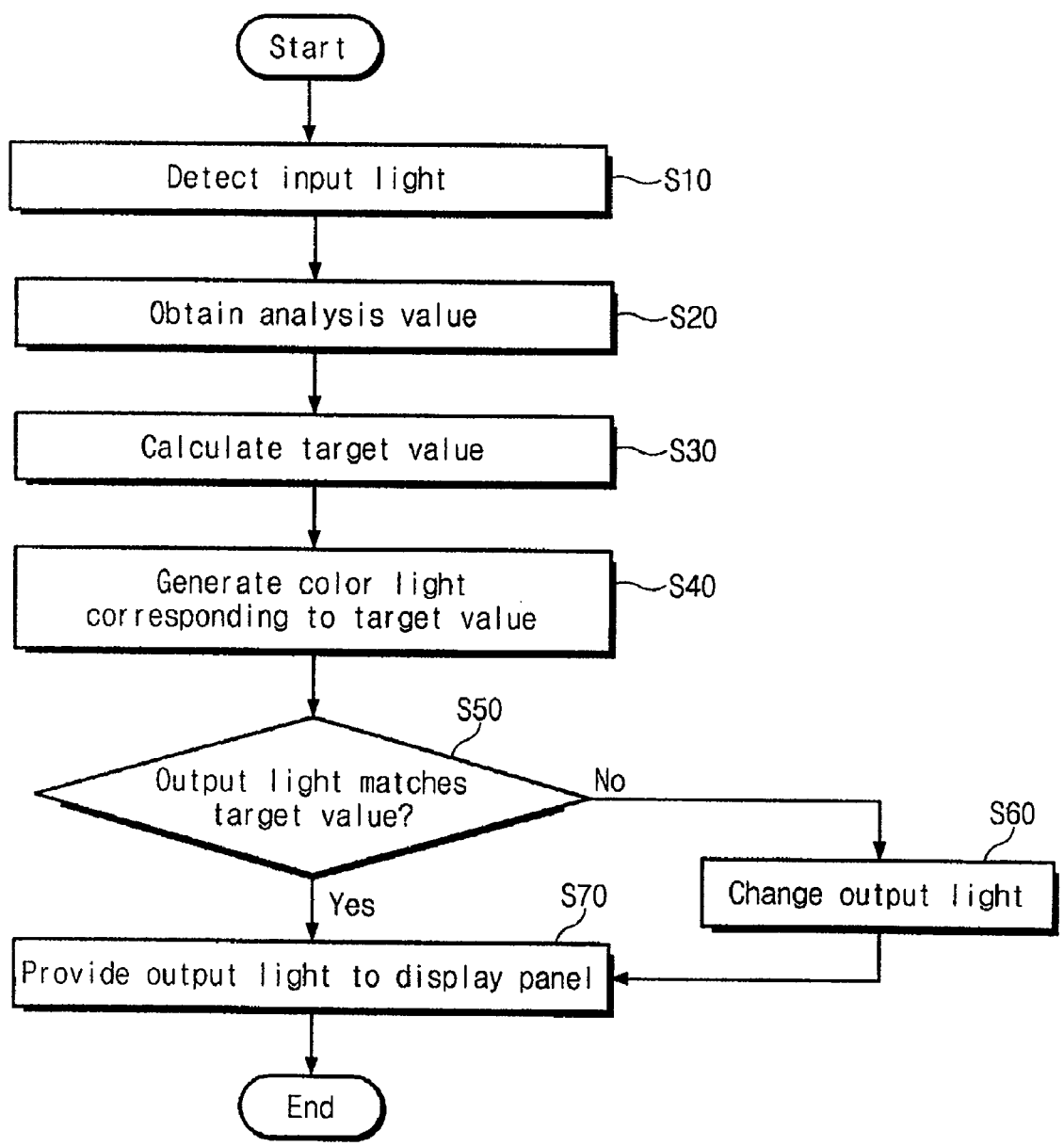
FIG. 2 is a flowchart showing the operational procedure of the liquid crystal display device illustrated in FIG. 1.

FIG. 2 is a flowchart showing the operational procedure of the liquid crystal display device illustrated in FIG. 1.

Referring to FIG. 2, the first sensor 1 detects the input light 3 (S10). The first sensor 1 may include various elements capable of detecting the input light 3. For instance, the first sensor 1 includes a solar cell, a CdS sensor, a photodiode, a photo transistor, a photo conductor, and the like. The controller 30 receives and analyzes such detected information, thereby outputting an analysis value for the input light 3 (S20). The analysis value is obtained by analyzing at least one of intensity of illumination, brightness, wavelength distribution, and color temperature of the input light 3. The quantity and luminosity of the input light 3 can be detected by analyzing the intensity of illumination and brightness of the input light 3. In addition, the source of the input light 3 can be detected by analyzing the wavelength distribution and color temperature.

Figure 3:
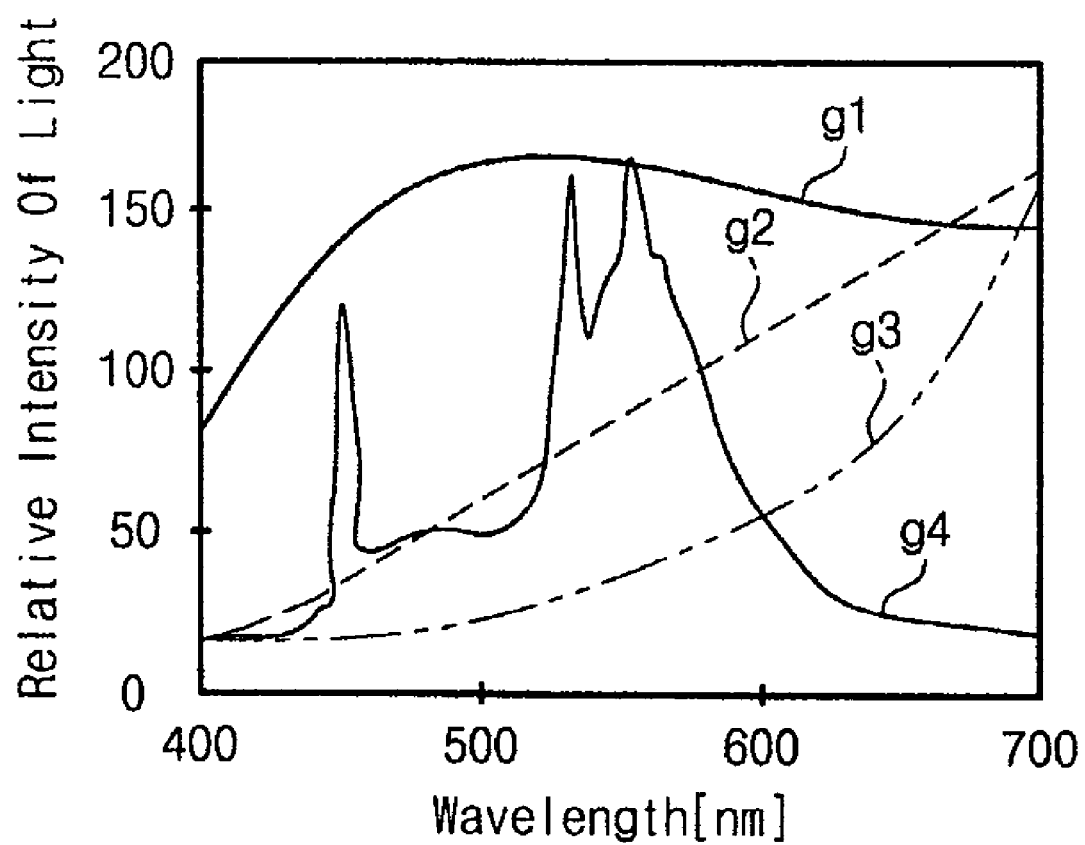
FIG. 3 is a graph showing wavelength distribution according to the relative intensity of light generated from various external light sources.

FIG. 3 is a graph showing the wavelength distribution according to relative intensity of light generated from various external light sources.

Referring to FIG. 3, the relative intensity of light varies depending on the type of the external light sources. In the case of a solar light source g1, light intensity in the wavelength range of 400 nm to 700 nm increases up to about 500 nm and then decreases. In the case of a glow lamp g2, light intensity linearly increases in the above wavelength range. Candlelight g3 shows a graph having a concave curvature shape in the above wavelength range and a fluorescent lamp g4 shows an irregular graph representing several peaks.

Figure 4:
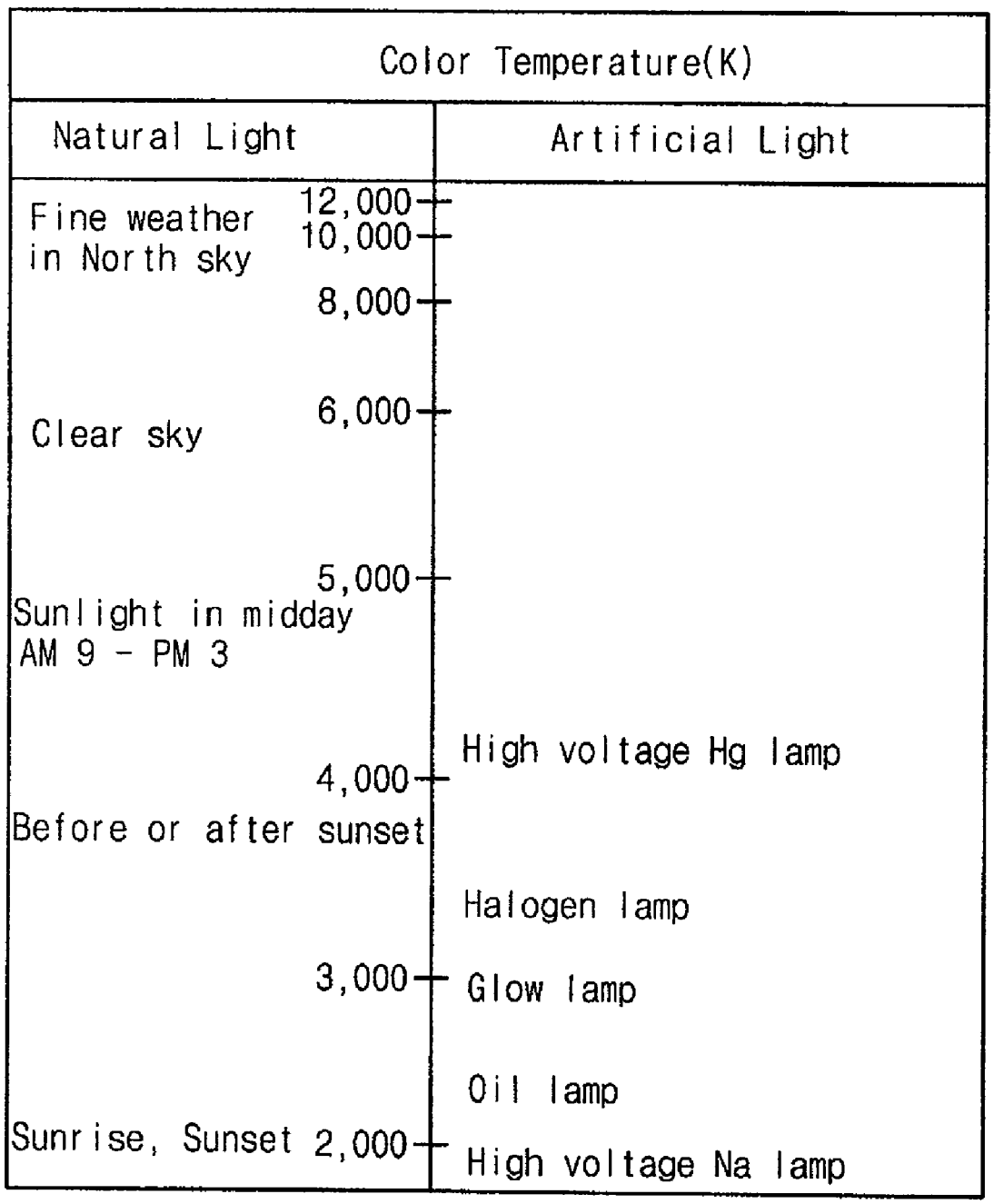
FIG. 4 is a view showing the color temperature of various natural light and artificial light.

FIG. 4 is a view showing the color temperature of various natural light and artificial light.

The color temperature refers to the temperature estimated based on a color of a light emitting member and is used when the temperature of the light emitting member cannot be directly measured. In general, the color temperature is slightly higher than the actual temperature and is expressed as the absolute temperature (K).

Referring to FIG. 4, in the case of natural light, the color temperature varies depending on the state of the sky or sunrise/sunset. In addition, in the case of artificial light, the color temperature of the glow lamp is different from that of the lamp. Further, the color temperature may vary even in the same lamps depending on the light emitting materials.

As shown In FIGS. 3 and 4, the controller 30 analyzes the wavelength distribution of the input light 3 and the color temperature to detect detailed information of the external light source. The controller 30 may include a database for the light having various wavelength distributions or the color temperature. In this case, the controller 30 readily detects detailed information of the input light 3 based on the database.

Referring again to FIG. 2, the controller 30 calculates the target value corrected according to the analysis value. The target value can be calculated based on at least one of the intensity of illumination, brightness, wavelength distribution and color temperature of the output light 4. For instance, if the analysis value represents high intensity of illumination or high brightness, the target value having low intensity of illumination or low brightness is calculated. This is because the user can readily recognize a dark image under bright external environment. If the input light 3 is detected within a desired time interval and the present analysis value is the same with or similar to the previous analysis value, there is no need to calculate a new target value.

The wavelength distribution or the color temperature can be used to calculate the target value. In this case, the target value can be easily calculated regardless of variation of the external light sources. For instance, if the wavelength distribution or the color temperature is employed, the type of the external light sources can be readily detected. Thus, if the comparison result between the present analysis value and the previous analysis value shows that the external light source is changed, a new target value corresponding to the change of the external light source can be established.

In particular, if the wavelength distribution or the color temperature is employed, when the input light 3 consists of a plurality of colored lights, the target value corresponding to each colored light can be calculated. For example, if the input light 3 is from a fluorescent lamp and has the wavelength distribution as shown in FIG. 3, the input light 3 has higher intensity at the wavelength of about 450 nm and about 550 nm. In this case, the target value is calculated such that the output light 4 has low intensity at the wavelength of about 450 nm and about 550 nm. In the same manner, if the color temperature is employed, the target value is calculated such that the output light 4 has a low color temperature when the input light 3 has a high color temperature.

In addition to the database used to calculate the analysis value, the controller 30 may have a database to calculate the target value.

If the target value is calculated as described above, the colored light corresponding to the target value is generated (S40). The light emitting unit 20 includes light sources that generate at least two different colored lights and the controller 30 individually controls the light sources. Thus, the output light 4 corresponding to the target value is generated by combining at least two different colored lights. If there is no combination of different colored lights, the output light 4 corresponding to the target value, which is calculated based on the wavelength distribution or the color temperature, cannot be obtained.

Then, the output light 4, which is the colored light detected by the second sensor 2, is compared with the target value (S50). Similar to the first sensor 1, the second sensor 2 includes various elements capable of detecting the light.

If the output light 4 detected by the second sensor 2 does not match the target value, the output light 4 is changed (S60). In this case, the controller 30 determines that the output light 4 has an error, so the controller 30 again controls the light sources to change the output light 4. If such an error is repeated, the parameter used to calculate the target value can be changed. For instance, if the target value has been calculated based on the wavelength distribution, the target value is calculated again based on the color temperature.

If the output light 4 matches the target value, the output light is provided to the display panel 10 (S70). Thus, the output light 4 passes through the display panel 10 and an image is displayed. Since the output light is adjusted according to the input light 3, the image has high quality.

Figure 5:
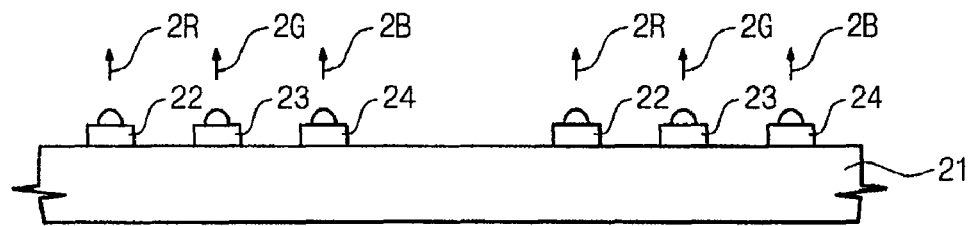
FIG. 5 is a view showing the operational process of a light emitting unit illustrated in FIG. 1.

FIG. 5 is a view showing the operational process of the light emitting unit 20 illustrated in FIG. 1.

Referring to FIG. 5, the light emitting unit 20 includes a substrate 21 and a plurality of light sources 22, 23 and 24 that generate at lest two different colored lights. The colored lights may include red lights 2R, green lights 2G and blue lights 2B that correspond to the three primary colors of light. In this case, the light sources 22, 23 and 24 are classified into a first light source 22 generating the red lights 2R, a second light source 23 generating the green lights 2G and a third light source 24 generating the blue lights 2B.

Besides the red light, green light and blue light, the colored lights include yellow light, cyan light and magenta light. In addition, the colored lights may include six colored lights which are obtained by combining the yellow light, cyan light and magenta light with the red light, green light and blue light. In this case, six light sources are provided to generate six colored lights.

The light sources 22, 23 and 24 can be prepared in the form of light emitting diodes. The light emitting diode creates carriers (electrons and holes) by using a semiconductor p-n junction structure and the light is generated when the carriers are recombined. The semiconductor includes compounds comprised of elements of 3B-group or 5B-group in the periodic table.

The red light 2R, the green light 2G and the blue light 2B generated from the first to third light sources 22, 23 and 24 are combined with each other, thereby forming the white output light 4. The white output light 4 passes through the display panel 10 to the exterior. In order to display the color image, the white output light 4 can be filtered into the colored light through the color filter provided in the display panel 10 before the white output light is output to the exterior.

Figure 6A:
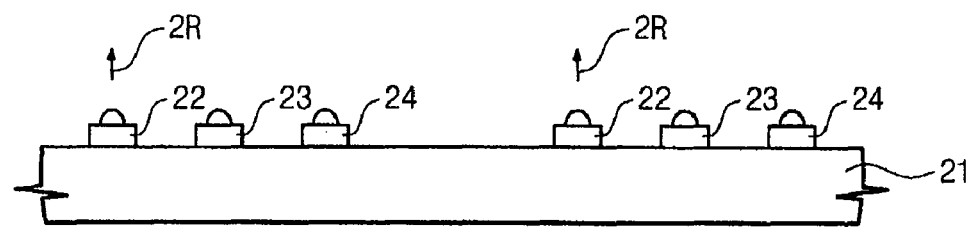
FIGS. 6A to 6C are views showing the operational process of a light emitting unit illustrated in FIG. 1 according to another embodiment of the present invention.
Figure 6B:
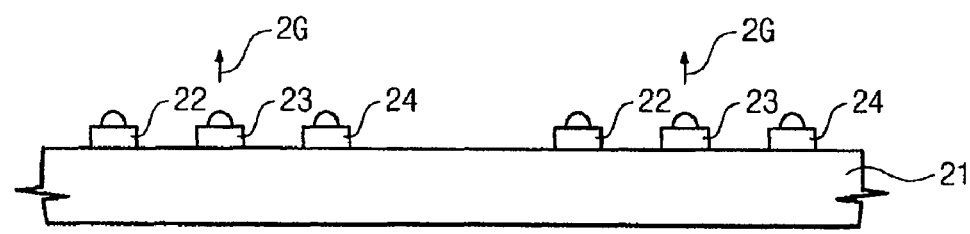
Figure 6C:
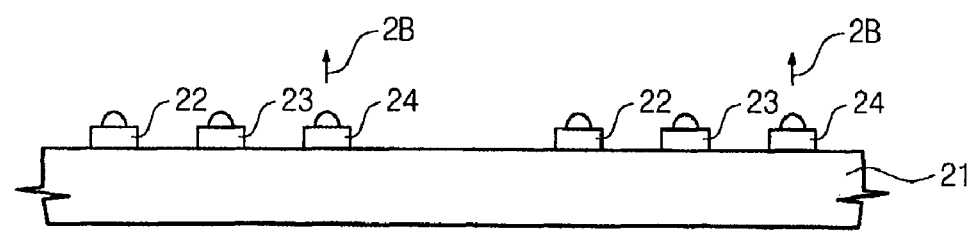

FIGS. 6A to 6C are views showing the operational process of the light emitting unit illustrated in FIG. 1 according to another embodiment of the present invention.

Referring to FIG. 6A, the first light source 22 is operated so that the red light 2R is provided to the display panel 10.

Referring to FIG. 6B, the second light source 23 is operated so that the green light 2G is provided to the display panel 10.

Referring to FIG. 6C, the third light source 24 is operated so that the blue light 2B is provided to the display panel 10.

In this manner, the red light 2R, the green light 2G and the blue light 2B are sequentially switched, so that the output light 4 is formed. In addition, the red light 2R, the green light 2G and the blue light 2B are rapidly switched, so that the image having the color obtained through the combination of three colors is displayed.

Figure 7:
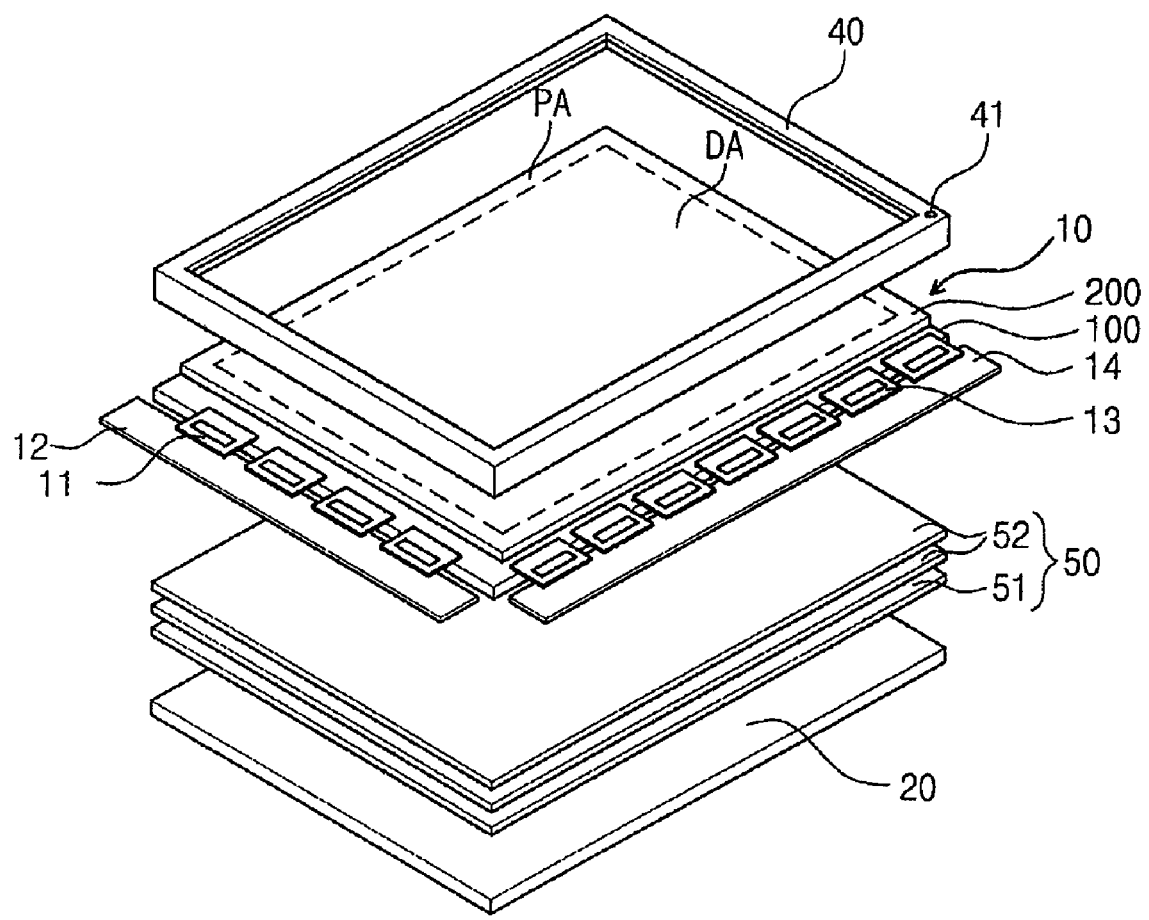
FIG. 7 is an exploded perspective view of the liquid crystal display device shown in FIG. 1.

FIG. 7 is an exploded perspective view of the liquid crystal display device shown in FIG. 1.

Referring to FIG. 7, the display panel 10 is divided into a display area DA displaying the image and a peripheral area PA that surrounds the display area DA. The display panel 10 includes first and second substrates 100 and 200 that face each other. In the peripheral area PA, a plurality of gate tape carrier packages 11 and data tape carrier packages 13 are attached to the first substrate 100. Printed circuit boards 12 and 14 are attached to the gate tape carrier packages 11 and data tape carrier packages 13, respectively. The gate tape carrier packages 11 and data tape carrier packages 13 are equipped with driving chips. The driving chips create the driving signals for the liquid crystal display device by using the input signal transmitted from the printed circuit boards 12 and 14 and transfer the driving signals to the display panel 10.

A fixing frame 40 that covers the peripheral area PA is coupled to the upper portion of the display panel 10. The fixing frame 40 has a light transmission section 41. The light transmission section 41 is prepared in the form of a perforation hole and the light passes through the light transmission section 41. The light transmission section 41 is formed in the peripheral area PA corresponding to the first sensor 1, so that the input light 3 incident from the exterior can reach the first sensor 1.

The light emitting unit 20 is mounted below the display panel 10. An optical film 50 can be interposed between the display panel 10 and the light emitting unit 20. The optical film 50 includes a diffusion film 51 and a prism film 52. The diffusion film 51 diffuses the output light 4 generated from the light emitting unit 20 such that the output light 4 can be uniformly distributed over the whole area of the display panel 10. The prism film 52 converts the traveling direction of the output light 4 in such a manner that the output light can be vertically incident into the display panel 10 as much as possible.

Figure 8:
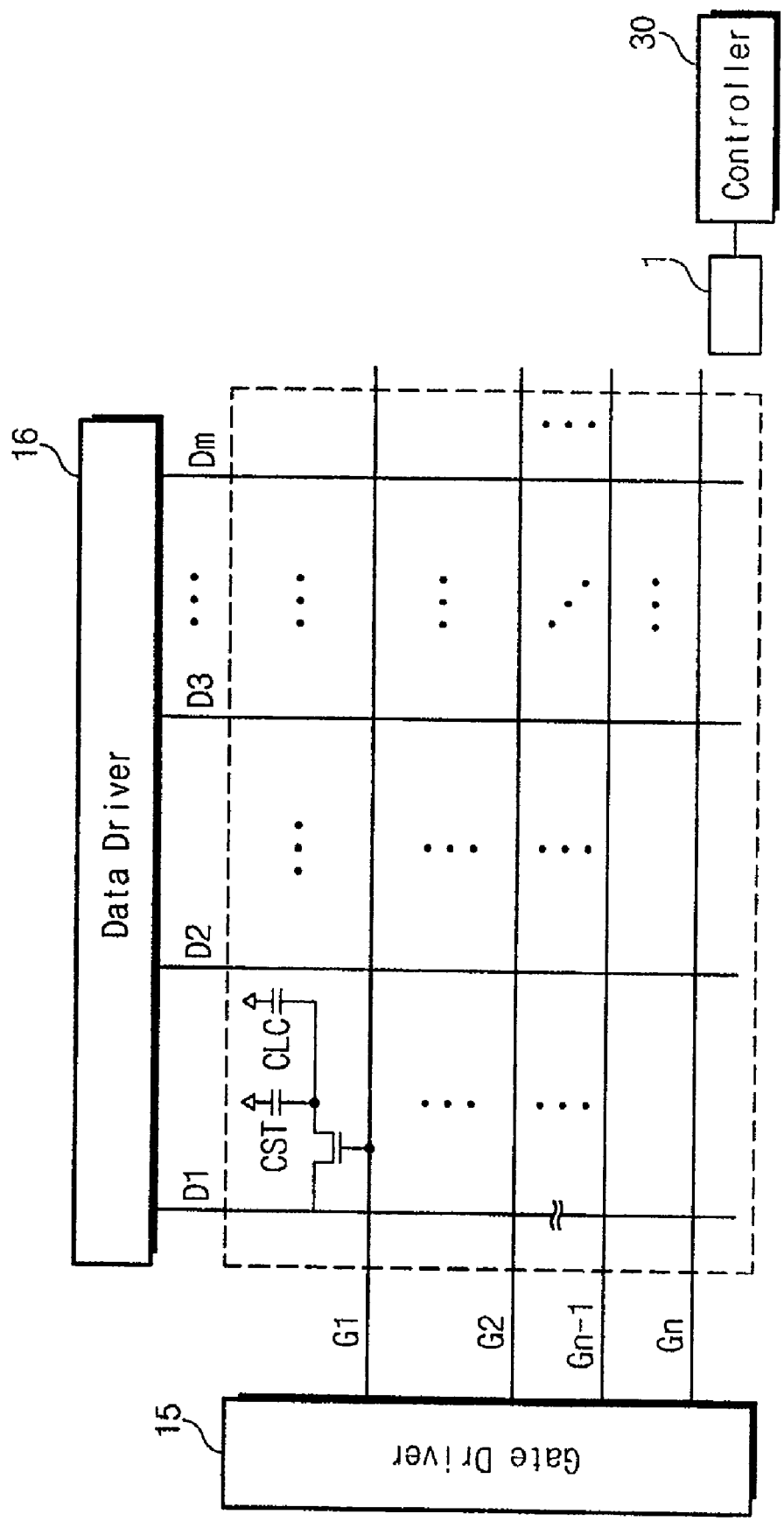
FIG. 8 is a block diagram of the liquid crystal display device shown in FIG. 7.

FIG. 8 is a block diagram of the liquid crystal display device shown in FIG. 7.

Referring to FIG. 8, the first substrate 10 includes a plurality of gate lines G1 to Gn and data lines D1 to Dm. Each of the gate lines G1 to Gn extends in the row direction and the gate lines G1 to Gn are aligned in the column direction. Each of the data lines D1 to Dm extends in the column direction and the data lines D1 to Dm are aligned in the row direction. The gate lines G1 to Gn cross the data lines D1 to Dm in the row and column directions, thereby defining the pixel areas. Each pixel area is provided with a switching device Q and a liquid crystal capacitor CLC and a storage capacitor CST, which are connected to the switching device Q.

The switching device Q includes a thin film transistor having a gate electrode, a source electrode and a drain electrode. The gate electrode is connected to one of the gate lines G1 to Gn, the source electrode is connected to one of the data lines D1 to Dm, and the drain electrode is connected to the liquid crystal capacitor CLC and the storage capacitor CST. The liquid crystal capacitor CLC includes a pixel electrode (not shown) formed on the first substrate 100, a common electrode (not shown) formed on the second substrate 200, and a liquid crystal layer that serves as a dielectric layer between the pixel and common electrodes. The storage capacitor CST includes a storage electrode (not shown) and a pixel electrode provided on the first substrate 100 and an insulating layer interposed between the storage and pixel electrodes. The storage capacitor CST supports the liquid crystal capacitor CLC and is selectively used in case of need.

The gate lines G1 to Gn are connected to a gate driver 15, which is mounted on the gate tape carrier package 11 in the form of a driving chip. The data lines D1 to Dm are connected to a data driver 16, which is mounted on the data tape carrier package 13 in the form of a driving chip.

Different from FIG. 7, the driving chips constituting the gate driver 15 and the data driver 16 can be mounted on the first substrate 100 without using the tape carrier packages 11 and 13. In addition, the gate driver 15 and the data driver 16 can be directly formed on the first substrate 100.

During the operation of the liquid crystal display device, the gate signal is applied to the gate lines G1 to Gn from the gate driver 15 and the data voltage is applied to the pixel electrode from the data driver 16 through the data lines D1 to Dm. In addition, a constant common voltage is applied to the common voltage. The differential voltage between the data voltage and the common voltage is represented as the charge voltage, that is, the pixel voltage of the liquid crystal capacitor CLC. The alignment of the liquid crystals in the liquid crystal layer is changed according to intensity of the pixel voltage, and an image is displayed corresponding to the alignment of the liquid crystals.

The first sensor 1 is positioned in the peripheral area PA corresponding to the light transmission section 41. The first sensor 1 detects the input light 3 that has been input through the light transmission section 41 and sends information of the input light 3 to the controller 30. As mentioned above, the first sensor 1 can be variously formed by using the solar battery, the photodiode, and the like. In this regard, the first sensor 1 mounted on the display panel 10 can be fabricated separately from the display panel 10, or can be fabricated together with the display panel 10. The latter will be explained in the following description.

Figure 9:
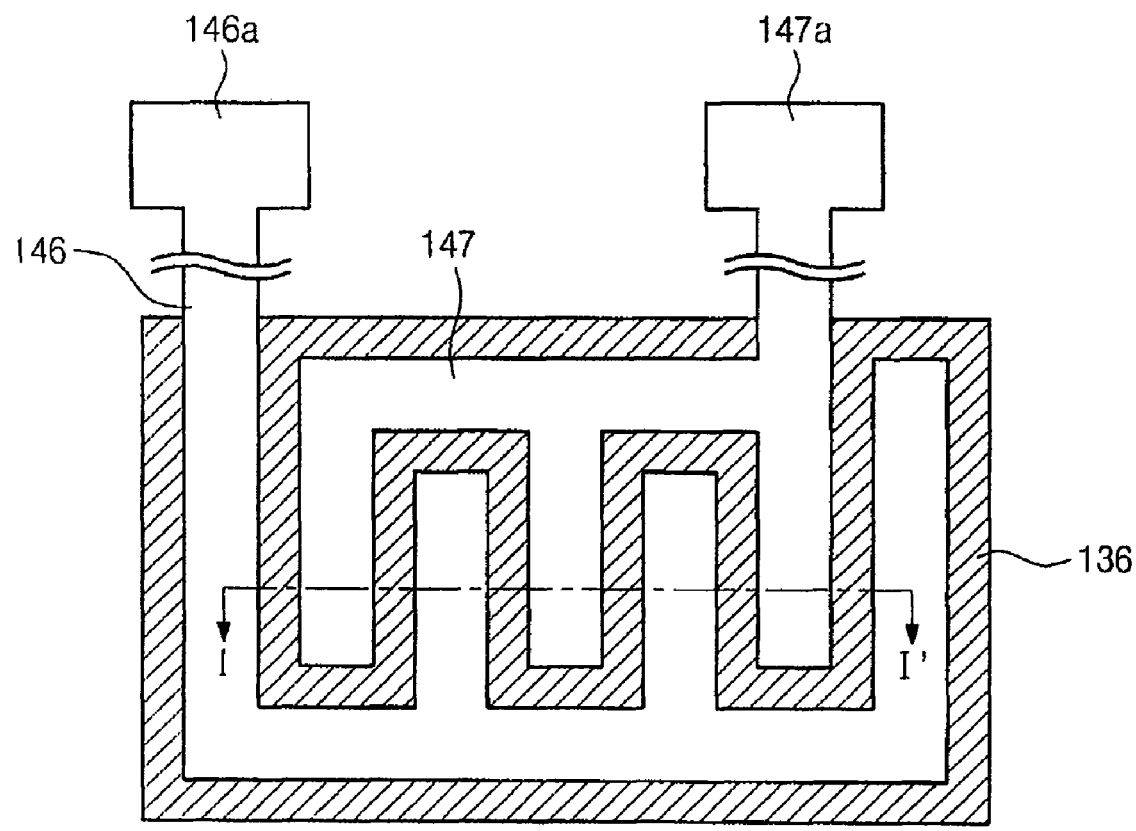
FIG. 9 is a plan view showing a first sensor illustrated in FIG. 8 in detail.
Figure 10:
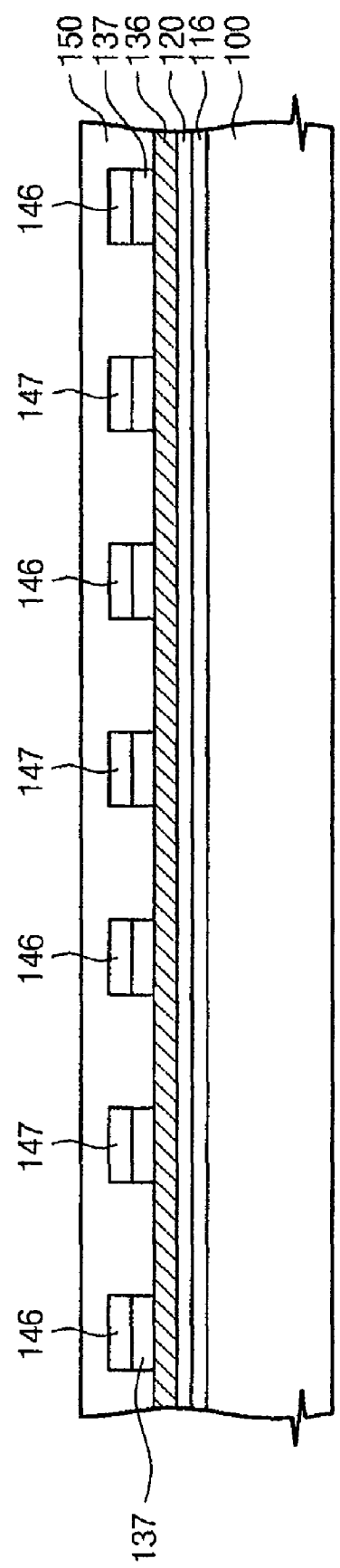
FIG. 10 is a sectional view taken along line I-I' shown in FIG. 9.

FIG. 9 is a plan view showing the first sensor illustrated in FIG. 8 in detail, and FIG. 10 is a sectional view taken along line I-I' shown in FIG. 9.

Referring to FIGS. 9 and 10, the liquid crystal display device includes a light blocking layer 116, a first insulating layer 120, a semiconductor layer 136, an ohmic contact layer 137, a first electrode 146, a second electrode 147 and a second insulating layer 150. The light blocking layer 116 includes an opaque material and is formed on the first substrate 100. The light blocking layer 116 blocks the output light 4 being transferred thereto from the light emitting unit 20 installed below the first substrate 100, so that the first sensor 1 can exclusively detect the input light 3, other than the output light 4. The first insulating layer 120 is formed on the light blocking layer 116.

The semiconductor layer 136 includes amorphous silicon and is formed on the insulating layer 120. The first and second electrodes 146 and 147 are formed on the semiconductor layer 136. The first and second electrodes 146 and 147 are spaced apart from each other, and are engaged with each other in a zigzag pattern when viewed from a plan view as shown in FIG. 9. As the light is irradiated onto the semiconductor layer 136, amorphous silicon molecules are excited, so that carriers such as electrons or holes are generated. The current flows between the first and second electrodes 146 and 147 due to the carriers. The current is measured from terminals 146a and 147a provided at end portions of the first and second electrodes 146 and 147.

A second insulating layer 150 is formed on the first and second electrodes 146 and 147. The second insulating layer 150 insulates the first electrode 146 from the second electrode 147 while protecting the first and second electrodes 146 and 147. The first sensor 1 is divided along the first and second electrodes 146 and 147 and may further includes an ohmic contact layer 137 formed on the semiconductor layer 136. The ohmic contact layer 137 is made from amorphous silicon including impurity ions. The ohmic contact layer 137 improves the electric contact characteristics between the first and second electrodes 146 and 147 and the semiconductor layer 136.

Figure 11:
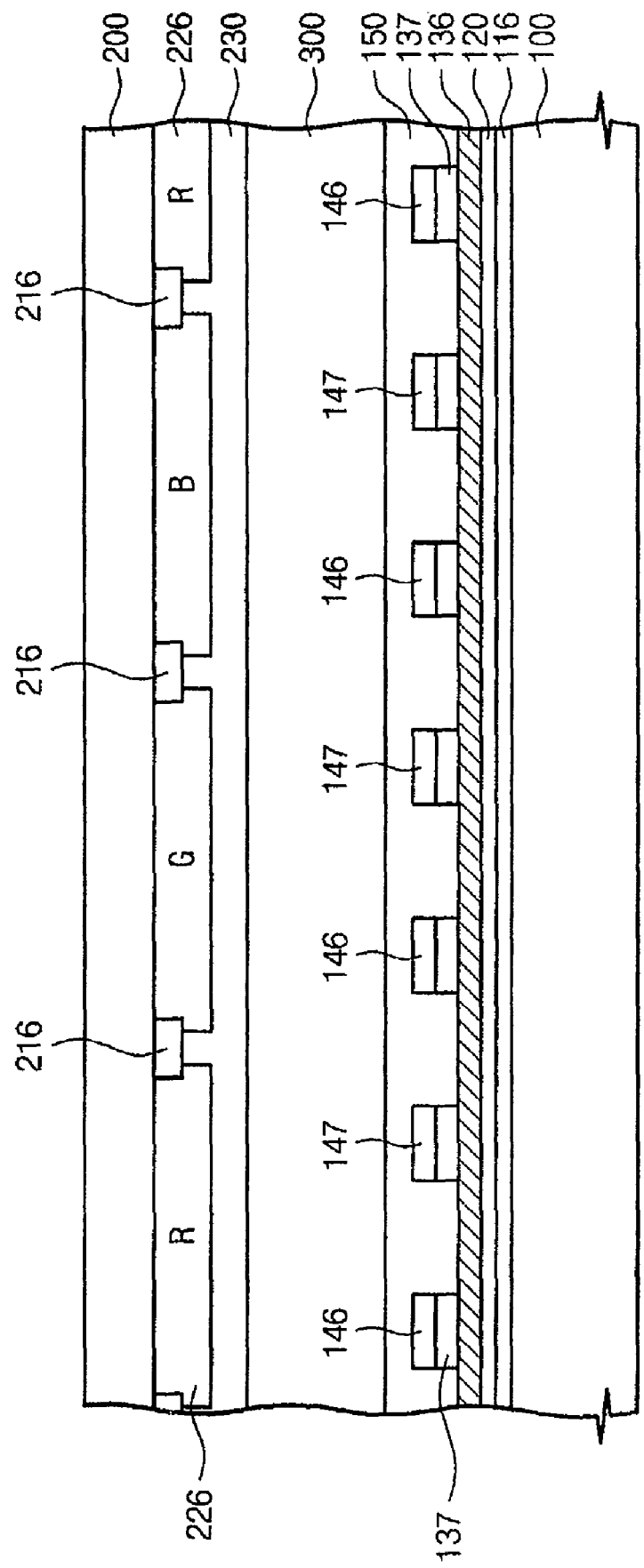
FIG. 11 is a sectional view taken along line I-I' shown in FIG. 9 according to another embodiment of the present invention.

FIG. 11 is a sectional view taken along line I-I' shown in FIG. 9 according to another embodiment of the present invention. In the present embodiment, the same reference numerals are assigned to the elements identical to the elements described in the previous embodiment, and detailed description thereof will be omitted.

Referring to FIG. 11, the liquid crystal layer 300 is interposed between the first and second substrates 100 and 200. The light blocking layer 116, the first insulating layer 120, the semiconductor layer, the ohmic contact layer 137, the first and second electrodes 146 and 147, and the second insulating layer 150 are formed on the first substrate 100.

A black matrix 216 and a color filter 226 are formed on the second substrate 200. The black matrix 216 includes an opaque material such that the input light 3 can be selectively incident into desired regions of the black matrix 216. The color filter 226 filters light having specific colors from the input light 3. For instance, the color filter 226 includes a red filter R, a green filter G and a blue filter B so as to filter red light, green light and blue light from the incident light 3 in corresponding regions. In this case, in a region of the first substrate 100 corresponding to the red filter R, the red light is detected from the input light 3. Similarly, the green filter G and the blue filter B filter the green light and blue light from the input light 3, respectively. In this way, the wavelength distribution in the input light 3 according to the color can be detected.

The overcoat layer 230 is formed on the black matrix 216 and the color filter 226. The overcoat layer 230 includes a transparent material such that the light can pass through the overcoat layer 230. The overcoat layer 230 planarizes the surface of the second substrate 200 and is selectively used in case of need.

Figure 12:
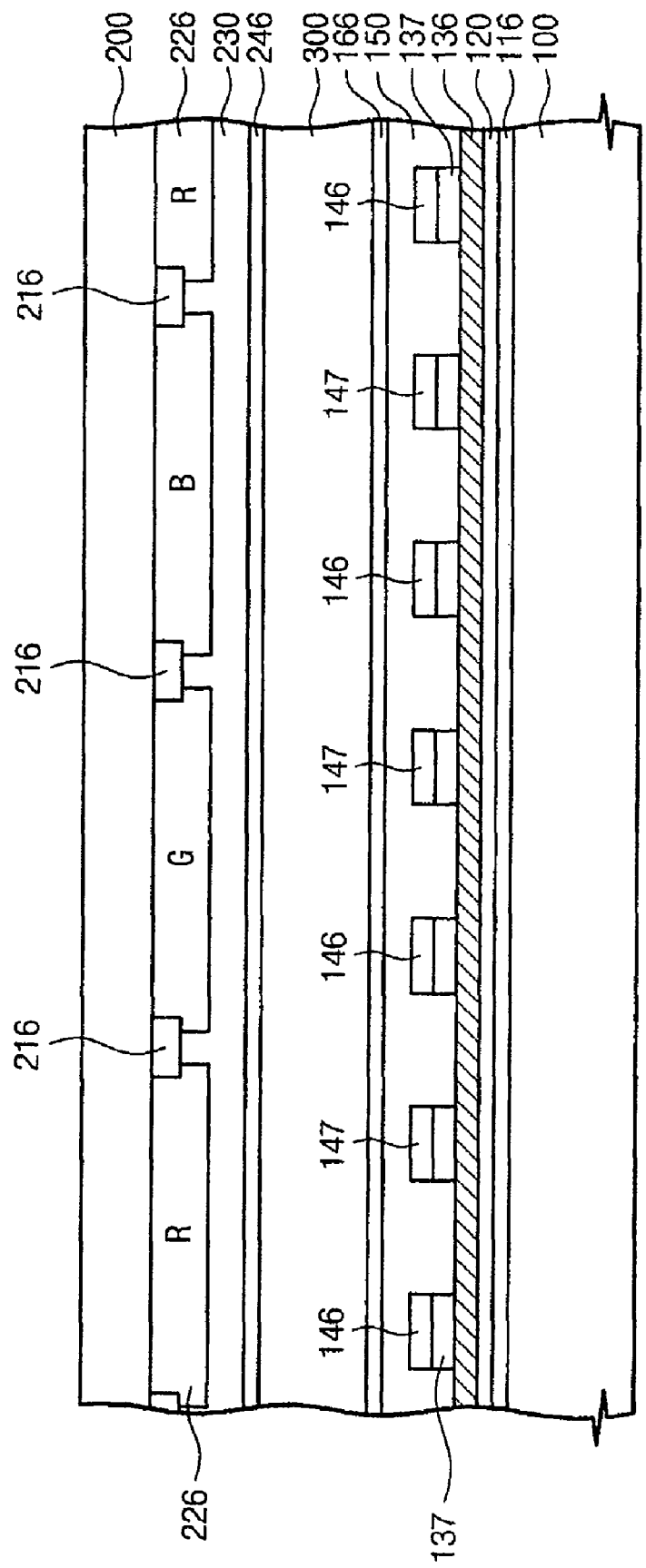
FIG. 12 is a sectional view taken along line I-I' shown in FIG. 9 according to still another embodiment of the present invention.

FIG. 12 is a sectional view taken along line I-I' shown in FIG. 9 according to still another embodiment of the present invention. In the present embodiment, the same reference numerals are assigned to the elements identical to the elements described in the previous embodiment, and detailed description thereof will be omitted.

Referring to FIG. 12, the first sensor 1 further includes first and second liquid crystal control electrodes 166 and 246. The first liquid crystal control electrode 166 is formed on the second insulating layer 150 of the first substrate 100. The second liquid crystal control electrode 246 is formed on the overcoat layer 230 of the second substrate 200. The first and second liquid crystal control electrodes 166 and 246 include transparent materials so as to allow the input light 3 to pass through the first and second liquid crystal control electrodes 166 and 246.

Different voltages are applied to the first and second liquid crystal control electrodes 166 and 246, so that the electric field is applied to the liquid crystal layer 300 due to the potential difference between the first and second liquid crystal control electrodes 166 and 246. Liquid crystals of the liquid crystal layer 300 are aligned in a predetermined direction by means of the electric field. After the input light 3 passes through the liquid crystal layer 300 aligned in the predetermined direction, various state changes of the input light 300 occurs.

For instance, the phase of the input light 3 may vary depending on the alignment of the liquid crystals. The electric field and the alignment direction of the liquid crystals can be adjusted by controlling the voltages applied to the first and second liquid crystal control electrodes 166 and 246. Thus, the phase variation of the input light 3 that passes through the liquid crystal layer 300 can be calculated based on the voltages applied to the first and second liquid crystal control electrodes 166 and 246. Such a phase variation is taken into consideration when the controller 30 calculates the analysis value.

If the first and second liquid crystal control electrodes 166 and 246 are not provided, the liquid crystals of the liquid crystal layer 300 are randomly aligned. In this case, the phase variation of the input light 3 that passes through the liquid crystal layer 30 cannot be precisely measured.

That is, if the first and second liquid crystal control electrodes 166 and 246 are not provided, the liquid crystals of the liquid crystal layer 300 may be randomly aligned due to the uncontrolled electric field applied around the liquid crystals of the liquid crystal layer 300. Thus, the phase variation of the input light 3 passing through the liquid crystal layer 300 cannot be calculated. However, according to the present embodiment, the phase variation of the input light 3 that passes through the liquid crystal layer 300 can be measured by using the first and second liquid crystal control electrodes 166 and 246.

That is, the precise analysis value for the input light 3 can be obtained by subtracting the value of the phase variation from the sensing value of the input light 3, and the analysis value is prevented from being changed while the input light 3 is passing through the liquid crystal layer 300, thereby improving the reliability of the analysis value. The structure that detects the input light 3 by using the first and second liquid crystal control electrodes 166 and 246 can be applied to various optical sensors having the structure different from the structure shown in FIG. 12.

Figure 13A:
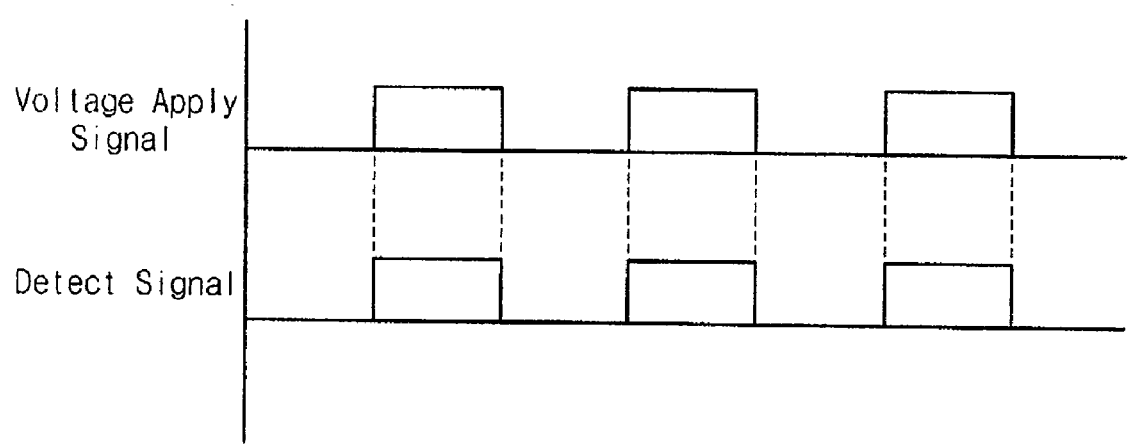
FIG. 13A is a timing view showing driving signals for a first sensor illustrated in FIG. 12.

FIG. 13A is a timing view showing driving signals for the first sensor illustrated in FIG. 12.

Referring to FIG. 13A, the voltage apply signal used in order to apply the voltage to the first and second liquid crystal control electrodes 166 and 246 is synchronized with the detect signal used in the first sensor 1 in order to detect the input light 3. Thus, the voltage is applied to the first and second liquid crystal control electrodes 166 and 246 according to the voltage apply signal, so that the electric field is applied to the liquid crystal layer 300. At this time, the first sensor 1 detects the input light 3 and then transmits the data to the controller 30.

Figure 13B:
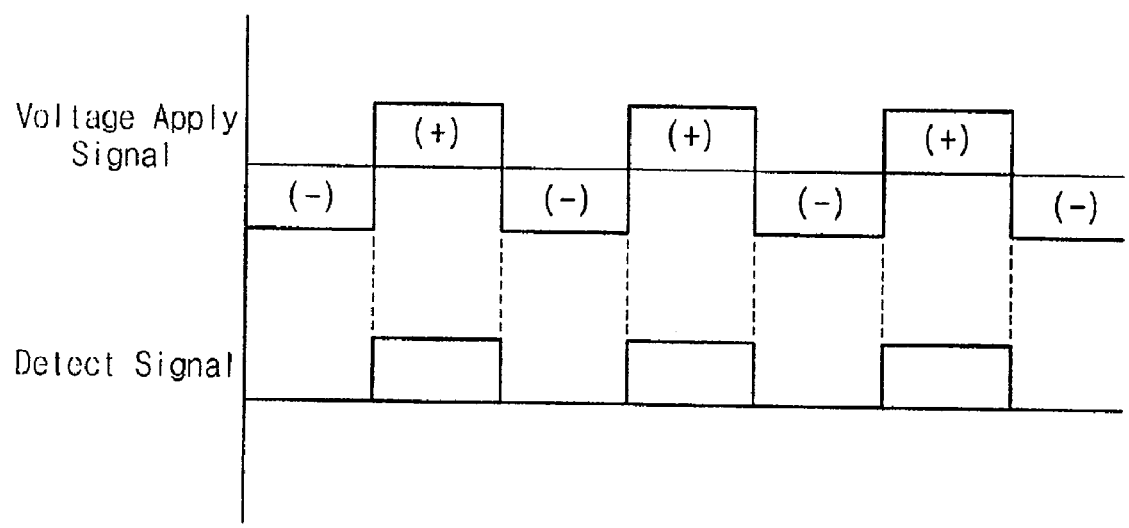
FIG. 13B is a timing view showing driving signals for a first sensor shown in FIG. 12 according to another embodiment of the present invention.

FIG. 13B is a timing view showing driving signals for the first sensor shown in FIG. 12 according to another embodiment of the present invention.

Referring to FIG. 13B, the voltage apply signal includes a signal having straight polarity (+) and a signal having reverse polarity (−). The straight polarity (+) and reverse polarity (−) may serve to reverse the direction of the electric field applied to the liquid crystal layer 30. For instance, if a constant reference voltage is applied to the second liquid crystal control electrode 246, a voltage higher than the reference voltage is applied to the first liquid crystal control electrode 166 by means of the signal having the straight polarity (+). In this case, the first electric field is formed in the direction from the first liquid crystal control electrode 166 to the second liquid crystal control electrode 246.

In addition, a voltage lower than the reference voltage is applied to the first liquid crystal control electrode 166 by means of the signal having the reverse polarity (−). In this case, the second electric field is formed in the direction from the second liquid crystal control electrode 246 to the first liquid crystal control electrode 166.

Due to the first and second electric fields, the liquid crystals are symmetrically aligned with respect to a direction which is perpendicular to the first and second liquid crystal control electrodes 166 and 246. If the liquid crystals are aligned in one direction, the quality of the liquid crystals is readily degraded. Such a symmetrical alignment of the liquid crystals can prevent the quality of the liquid crystals from being readily degraded. As shown in FIG. 13B, the detect signal of the first sensor 1 used to detect the input light 3 is synchronized with one of the signal having the straight polarity (+) and the signal having the reverse polarity (−).

Hereinafter, the method of manufacturing the liquid crystal display device having the display panel 10 and the first sensor 1 will be described.

FIGS. 14A to 14G are sectional views showing the method of manufacturing the liquid crystal display device according to an exemplary embodiment of the present invention. The present embodiment discloses the method of simultaneously forming the thin film transistor of the above-described display panel and the first sensor. In the present embodiment, the first sensor has the structure identical to that of the first sensor described in the previous embodiment, and the same reference numerals are assigned to the elements identical to those of the previous embodiment. Here, the name of some redundant elements will be changed in order to distinguish these elements from the elements simultaneously formed on the thin film transistor.

Referring to FIG. 14A, the gate electrode 111 is formed on the first substrate 100 in the display area, and the light blocking layer 116 is formed on the first substrate 100 in the peripheral area PA. The gate electrode 111 and the light blocking layer 116 are fabricated separately from each other through different processes. The gate electrode 111 includes a conductive metal, such chrome, aluminum or copper. Since the conductive metal blocks the light, the conductive metal can be used as the light blocking layer 116. Thus, the gate electrode 111 and the light blocking layer 116 can be simultaneously formed by patterning the conductive layer after depositing the conductive layer on the first substrate 100.

Referring to FIG. 14B, the first insulating layer 120 is formed on the gate electrode 111 and the light blocking layer 116 to cover the entire surface of the first substrate 100. The first insulating layer 120 can be formed through plasma chemical vapor deposition using silicon nitride.

The first semiconductor layer 131 and the first ohmic contact layer 132 are formed on the first insulating layer 120 in the display area DA such that the first semiconductor layer 131 and the first ohmic contact layer 132 can overlap with the gate electrode 111. The second semiconductor layer 136 and the second ohmic contact layer 137 are formed on the first insulating layer 120 in the peripheral area PA such that the second semiconductor layer 136 and the second ohmic contact layer 137 can overlap with the light blocking layer 116. The first and second semiconductor layers 131 and 136 can be simultaneously formed by patterning amorphous silicon after depositing the amorphous silicon on the first insulating layer 120. In the same manner, the first and second ohmic contact layers 132 and 137 can be simultaneously formed using amorphous silicon including impurity ions.

Referring to FIG. 14C, the source electrode 141 and the drain electrode 142 are formed on the first ohmic contact layer 132 in the display area DA. The first and second electrodes 146 and 147 are formed on the second ohmic contact layer 137 in the peripheral area PA. The source electrode 141, the drain electrode 142, the first electrode 146, and the second electrode 147 can be simultaneously formed by patterning the conductive metal after depositing the conductive metal on the entire surface of the first substrate 100.

The source electrode 141 and the drain electrode 142 are spaced apart from each other while interposing the gate electrode 111 therebetween. The first ohmic contact layer 132 is patterned in such a manner that the first ohmic contact layer 132 can be divided along the source electrode 141 and the drain electrode 142. Thus, the thin film transistor including the gate electrode 111, the source electrode 141 and the drain electrode 142 is obtained. The first and second electrodes 146 and 147 are spaced apart from each other and the second ohmic contact layer 137 is patterned such that the second ohmic contact layer 137 can be divided along the first and second electrodes 146 and 147.

Referring to FIG. 14D, the second insulating layer 150 is formed on the source electrode 141, the drain electrode 142, the first electrode 146 and the second electrode 147 such that the entire surface of the first substrate 100 can be covered with the second insulating layer 150. The second insulating layer 150 is formed through the method identical to the method of forming the first insulating layer 120. The second insulating layer 150 protects the thin film transistor and insulates the first and second electrodes 146 and 147 from each other. The second insulating layer 150 is patterned such that a contact hole 155 exposing the drain electrode 142 is formed in the insulating layer 150.

The pixel electrode 161 is formed on the second insulating layer 150 in the display area and the first liquid crystal control electrode 166 is formed on the second insulating layer 150 in the peripheral area PA. The pixel electrode 161 and the first liquid crystal control electrode 166 can be simultaneously formed by patterning a transparent conductive layer after forming the transparent conductive layer on the second insulating layer 150. The transparent conductive layer can be formed by depositing indium zinc oxide or indium tin oxide.

If the light blocking layer 116 is simultaneously formed with the gate electrode 111 in the step shown in FIG. 14A, since the light blocking layer 116 includes the conductive metal, the light blocking layer 116 may serve as an electrode. In this case, the light blocking layer 116 is used as the liquid crystal control electrode. Thus, only the pixel electrode 161 is formed by patterning the transparent conductive layer and the process of forming the first liquid crystal control electrode 166 can be omitted.

Referring to FIG. 14E, first and second black matrixes 122 and 126 are formed on the second substrate 200. In addition, first and second color filters 211 and 216 are formed on the first and second black matrixes 122 and 126, respectively. The first black matrix 211 is provided at a boundary between the pixel areas in the display area, and the first color filter 221 is positioned corresponding to the pixel area. A predetermined portion of the second black matrix 226 is opened in the peripheral area PA, and the second color filter 226 is filled in the opening of the second black matrix. The first and second color filters 221 and 226 include various color filters, such as a red filter, a green filter, and a blue filter which are alternately disposed.

The first and second black matrixes 211 and 216 can be simultaneously formed by depositing an organic photoresist film on the second substrate 200 and then exposing and developing the organic photoresist film. In addition, the first and second color filters 221 and 226 can be simultaneously formed by depositing a photoresist film having a color on the first and second black matrixes 211 and 216 and then exposing and developing the photoresist film.

Referring to FIG. 14F, the overcoat layer 230 is formed on the first and second color filters 221 and 226. The overcoat layer 230 can be formed by coating transparent resin. The common electrode 241 and the second liquid crystal control electrode 246 are formed on the overcoat layer 230. The common electrode 241 and the second liquid crystal control electrode 246 can be formed by depositing a transparent conductive layer on the overcoat layer 230.

The transparent conductive layer can be formed by depositing indium zinc oxide or indium tin oxide. In this case, the common electrode 241 is connected to the second liquid crystal control electrode 246, so that the same voltage is applied thereto.

The transparent conductive layer can be patterned such that the common electrode 241 is separated from the second liquid crystal control electrode 246. In this case, different voltages are applied to the common electrode 241 and the second liquid crystal control electrode 246, respectively.

Figure 14G:
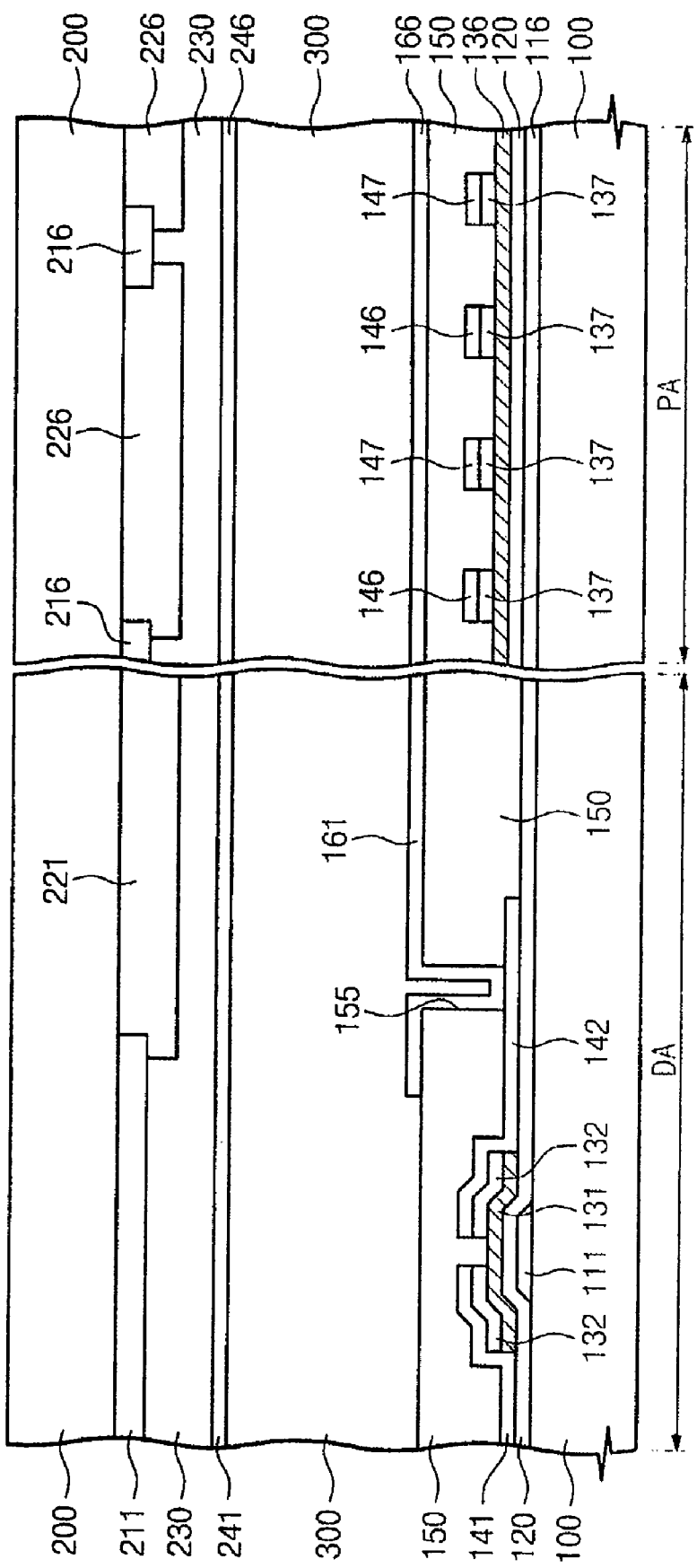

Referring to FIG. 14G, the first substrate 100 is combined with the second substrate 200 and the liquid crystal layer 300 is interposed between the first and second substrates 100 and 200. The liquid crystal layer 300 can be formed by injecting liquid crystals between the first and second substrates 100 and 200. In addition, the liquid crystal layer 300 can be formed by combining the first and second substrates 100 and 200 with each other after dropping liquid crystals onto one of the first and second substrates 100 and 200.

According to the embodiments of the present invention, the input light incident from the exterior can be precisely analyzed, so that the image having high quality can be displayed corresponding to the input light.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A liquid crystal display device comprising:
    a display panel that displays an image using a liquid crystal layer;
    a first sensor provided in the display panel to detect input light incident from outside the display panel;
    a light emitting unit having at least two different light sources and providing output light having various colors to the display panel;
    a second sensor for detecting the output light provided to the display panel; and
    a controller for analyzing the input light detected by the first sensor, calculating a target value for output light to be delivered to the display panel, individually controlling the light sources to generate colored lights corresponding to the target value of the output light, and inspecting whether the output light detected by the second sensor satisfies the target value.

2. The liquid crystal display device of claim 1, wherein the controller analyzes the input light by using at least one of intensity of illumination, brightness, wavelength distribution, and color temperature of the input light.

3. The liquid crystal display device of claim 2, wherein the target value is calculated based on at least one of intensity of illumination, brightness, wavelength distribution, and color temperature of the output light.

4. The liquid crystal display device of claim 3, wherein the controller includes a database that stores the target value based on an analysis of the input light.

5. The liquid crystal display device of claim 3, wherein when an analysis of the input light represents a high intensity of illumination or high brightness, the controller calculates the target value having low intensity of illumination or low brightness, respectively, and wherein when the analysis of the input light represents higher color temperature, the controller calculates the target value such that the output light has a lower color temperature.

6. The liquid crystal display device of claim 1, wherein the light sources generate red light, blue light and green light.

7. The liquid crystal display device of claim 6, wherein the output light is white light obtain by combining the red light, the blue light and the green light.

8. The liquid crystal display device of claim 6, wherein the output light is colored by the red light, the blue light or the green light.

9. The liquid crystal display device of claim 6, wherein the light sources include light emitting diodes.

10. The liquid crystal display device of claim 1, wherein the display panel further comprises first and second substrates that face each other while interposing the liquid crystal layer therebetween.

11. The liquid crystal display device of claim 10, wherein the first substrate includes a display area where pixel areas are defined and a peripheral area surrounding the display area, and the first sensor is positioned in the peripheral area.

12. The liquid crystal display device of claim 11, wherein the first sensor comprises:
    a first liquid crystal control electrode formed on the first substrate in adjacent to the liquid crystal layer; and
    a second liquid crystal control electrode formed on the second substrate in adjacent to the liquid crystal layer, the second liquid crystal control electrode interacting with the first liquid crystal control electrode so as to apply an electric field to the liquid crystal layer.

13. The liquid crystal display device of claim 12, wherein the first sensor comprises:
    a light blocking layer formed on the first substrate;
    a semiconductor layer formed on the first substrate;
    a first electrode formed between the semiconductor layer and the first liquid crystal control electrode; and
    a second electrode formed between the semiconductor layer and the first liquid crystal control electrode while being spaced apart from the first electrode.

14. The liquid crystal display device of claim 12, wherein the first sensor further comprises a color filter provided between the second substrate and the second liquid crystal control electrode.

15. The liquid crystal display device of claim 12, wherein the first sensor detects the input light incident thereto when the electric field is applied, and the controller analyzes the input light by using state variation of the input light, which occurs when the input light passes through the liquid crystal layer to which the electric field is applied.

16. The liquid crystal display device of claim 12, wherein the electric field includes first and second electric fields, which are alternately applied in opposition to each other, the first sensor detects the input light incident thereto when the first electric field is applied, and the controller analyzes the input light by using state variation of the input light, which occurs when the input light passes through the liquid crystal layer to which the first electric field is applied.

17. The liquid crystal display device of claim 11, further comprising a fixing frame, which is coupled to an upper portion of the display panel so as to cover an outer portion of the display area and has a transmission section in a region corresponding to the first sensor so as to allow the input light to pass therethrough.

18. The liquid crystal display device of claim 17, wherein the transmission section is a perforation hole formed through the fixing frame.

19. A liquid crystal display device comprising:
    a first substrate having a display area where pixel areas are defined and a peripheral area surrounding the display area;
    a second substrate facing the first substrate;
    a liquid crystal layer interposed between the first and second substrates; and
    a sensor provided in the peripheral area so as to detect input light incident through the second substrate,
    wherein the sensor comprises:
    a first liquid crystal control electrode formed on the first substrate in adjacent to the liquid crystal layer; and
    a second liquid crystal control electrode formed on the second substrate in adjacent to the liquid crystal layer, the second liquid crystal control electrode interacting with the first liquid crystal control electrode so as to apply an electric field to the liquid crystal layer.

20. The liquid crystal display device of claim 19, wherein the sensor detects the input light incident thereto when the electric field is applied, and information about the input light includes state variation of the input light, which occurs when the input light passes through the liquid crystal layer to which the electric field is applied.

21. The liquid crystal display device of claim 19, wherein the electric field includes first and second electric fields, which are alternately applied in opposition to each other, the sensor detects the input light incident thereto when the first electric field is applied, and information about the input light includes state variation of the input light, which occurs when the input light passes through the liquid crystal layer to which the first electric field is applied.

22. The liquid crystal display device of claim 19, wherein the sensor comprises:
   a light blocking layer formed on the first substrate;
   a semiconductor layer formed on the light blocking layer;
   a first electrode formed on the semiconductor layer; and
   a second electrode formed on the semiconductor layer while being spaced apart from the first electrode.

23. The liquid crystal display device of claim 19, wherein the sensor further comprises a color filter formed on the second substrate.

24. A method of driving a liquid crystal display device, the method comprising:
   detecting input light incident into a display panel having a liquid crystal layer;
   obtaining an analysis value for the detected input light;
   calculating a target value corrected according to the analysis value;
   generating colored light corresponding to the target value by individually controlling at least two different light sources that generate colored lights different from each other; and
   providing output light generated by the colored lights to the display panel.

25. The method of claim 24, wherein further comprising inspecting whether the output light satisfies the target value and changing the output light when the output light does not satisfy the target value.

26. The method of claim 24, wherein the analysis value is obtained by analyzing at least one of intensity of illumination, brightness, wavelength distribution, and color temperature of the input light.

27. The method of claim 24, wherein the target value is calculated based on at least one of intensity of illumination, brightness, wavelength distribution, and color temperature of the output light.

28. The method of claim 27, wherein the calculating the target value comprises using a database in which the target value corresponding to the analysis value is stored.

* * * * *